United States Patent
Burgess et al.

(10) Patent No.: US 8,790,981 B2
(45) Date of Patent: Jul. 29, 2014

(54) LOW COST HIGH VOLTAGE POWER FET AND FABRICATION

(75) Inventors: Byron Neville Burgess, Allen, TX (US); Sameer P. Pendharkar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 107 days.

(21) Appl. No.: 12/536,200

(22) Filed: Aug. 5, 2009

(65) Prior Publication Data

US 2010/0032774 A1   Feb. 11, 2010

Related U.S. Application Data

(60) Provisional application No. 61/086,382, filed on Aug. 5, 2008.

(51) Int. Cl.
| | | |
|---|---|---|
| *H01L 21/336* | (2006.01) | |
| *H01L 29/66* | (2006.01) | |
| *H01L 29/10* | (2006.01) | |
| *H01L 29/78* | (2006.01) | |
| *H01L 29/08* | (2006.01) | |
| *H01L 29/45* | (2006.01) | |

(52) U.S. Cl.
CPC ...... *H01L 29/7835* (2013.01); *H01L 29/66659* (2013.01); *H01L 29/105* (2013.01); *H01L 29/0847* (2013.01); *H01L 29/456* (2013.01)
USPC .......................................... 438/291; 438/297

(58) Field of Classification Search
CPC ...................... H01L 29/7801; H01L 29/66659
USPC .................................. 438/291, 289, 294, 297
See application file for complete search history.

(56) References Cited

U.S. PATENT DOCUMENTS

| | | | | |
|---|---|---|---|---|
| 5,237,193 | A | * | 8/1993 | Williams et al. ............... 257/336 |
| 5,956,588 | A | * | 9/1999 | Choi et al. ..................... 438/291 |
| 6,063,678 | A | * | 5/2000 | D'Anna ........................ 438/291 |
| 7,235,451 | B2 | * | 6/2007 | Hao et al. ....................... 438/306 |
| 2002/0117714 | A1 | * | 8/2002 | Hebert ........................... 257/339 |
| 2008/0217693 | A1 | * | 9/2008 | Wang et al. .................... 257/352 |

* cited by examiner

*Primary Examiner* — Stephen W Smoot
*Assistant Examiner* — Sun M Kim
(74) *Attorney, Agent, or Firm* — Warren L. Franz; Frederick J. Telecky, Jr.

(57) ABSTRACT

A power field effect transistor (FET) is disclosed which is fabricated in as few as six photolithographic steps and which is capable of switching current with a high voltage drain potential (e.g., up to about 50 volts). In a described n-channel metal oxide semiconductor (NMOS) embodiment, a drain node includes an n-well region with a shallow junction gradient, such that the depletion region between the n-well and the substrate is wider than 1 micron. Extra photolithographic steps are avoided using blanket ion implantation for threshold adjust and lightly doped drain (LDD) implants. A modified embodiment provides an extension of the LDD region partially under the gate for a longer operating life.

16 Claims, 13 Drawing Sheets

LOW COST HIGH VOLTAGE POWER FET AND FABRICATION

This is a non-provisional of Application No. 61/086,382 filed Aug. 5, 2008, the entirety of which is incorporated herein by reference.

BACKGROUND

This invention relates to the field of integrated circuits; and, more particularly, to low cost, high voltage power field effect transistors (FETs) and their fabrication.

Integrated circuits which interface to analog inputs and outputs (I/Os) and perform specialized functions, such as controlling microelectromechanical systems (MEMS) modules, heaters, valves, relays and other applications, are often built using low cost fabrication process sequences. Photolithographic operations are typically the most costly and complex fabrication process steps involved in building an IC, so a common aspect of low cost fabrication process sequences is a simplified device architecture built with a minimal number of photolithographic steps. Components in ICs built on a simplified device architecture have limited complexity and are not capable of operating at high voltages, for example above 20 volts, so that IC design for specialized functions with high voltage I/Os involves a trade-off between performance and fabrication cost. Accordingly, there is a need for integrated circuits built with few photolithographic steps and capable of controlling higher voltage inputs and outputs.

SUMMARY

The invention provides a low cost, high voltage power field effect transistor (FET) and methods for its fabrication.

In a described example embodiment, an integrated circuit is provided that has an n-channel metal oxide semiconductor (MOS) power FET fabricated with just a small number of photolithographic operations and which can modulate drain current when 30 volts is applied to a drain contact. As described further below, the example MOS power FET embodiment has an n-well with a shallow junction gradient formed in its drain area to provide a wide depletion region which significantly reduces a voltage drop across the gate dielectric. Fabrication with few photolithographic operations is achieved by performing blanket threshold adjust and lightly doped drain (LDD) ion implant processes, without photoresist patterns to block the implants from some regions. A modified example provide an LDD extension in an additional photolithographic step to provide a longer operating lifetime.

An advantage of the instant invention is that functions currently requiring complex integrated circuits may be performed by simpler integrated circuits incorporating the principles of the invention, with attendant cost savings.

DETAILED DESCRIPTION OF EXAMPLE EMBODIMENTS

The principles of the invention are described with reference to an example embodiment of an integrated circuit including a power field effect transistor (FET) fabricated with minimal photolithographic operations. The example embodiment provides an FET in the form of a low cost metal oxide semiconductor (MOS) transistor fabricated with as few as six photolithographic steps through contacts, with a doped well having a shallow junction gradient extending into a drain region, a blanket threshold adjust ion implantation step and a blanket lightly doped drain (LDD) ion implantation step, which can operate at high voltage (e.g., around 50 volts) drain potential. A modified embodiment provides the metal oxide semiconductor (MOS) transistor fabricated built with an additional photolithographic step, with the doped well having a shallow junction gradient extending into a drain region and a blanket threshold adjust ion implantation step, which can operate at high voltage (e.g., 50 volts) drain potential for an extended period of time (typically, more than 1000 hours).

FIGS. 1A-1J illustrate steps in a method of fabricating an integrated circuit including a MOS transistor. For purposes of brevity, only the steps in fabrication of a device including an n-channel MOS (NMOS) transistor are described; however, those skilled in the art to which the invention relates will appreciate that by applying opposite doping (that is, by applying p-type doping where n-type doping is used, and vice versa) the same principles can be applied to the fabrication of an integrated circuit including a p-channel MOS (PMOS) transistor (or both NMOS and PMOS transistors).

Figure 1A:
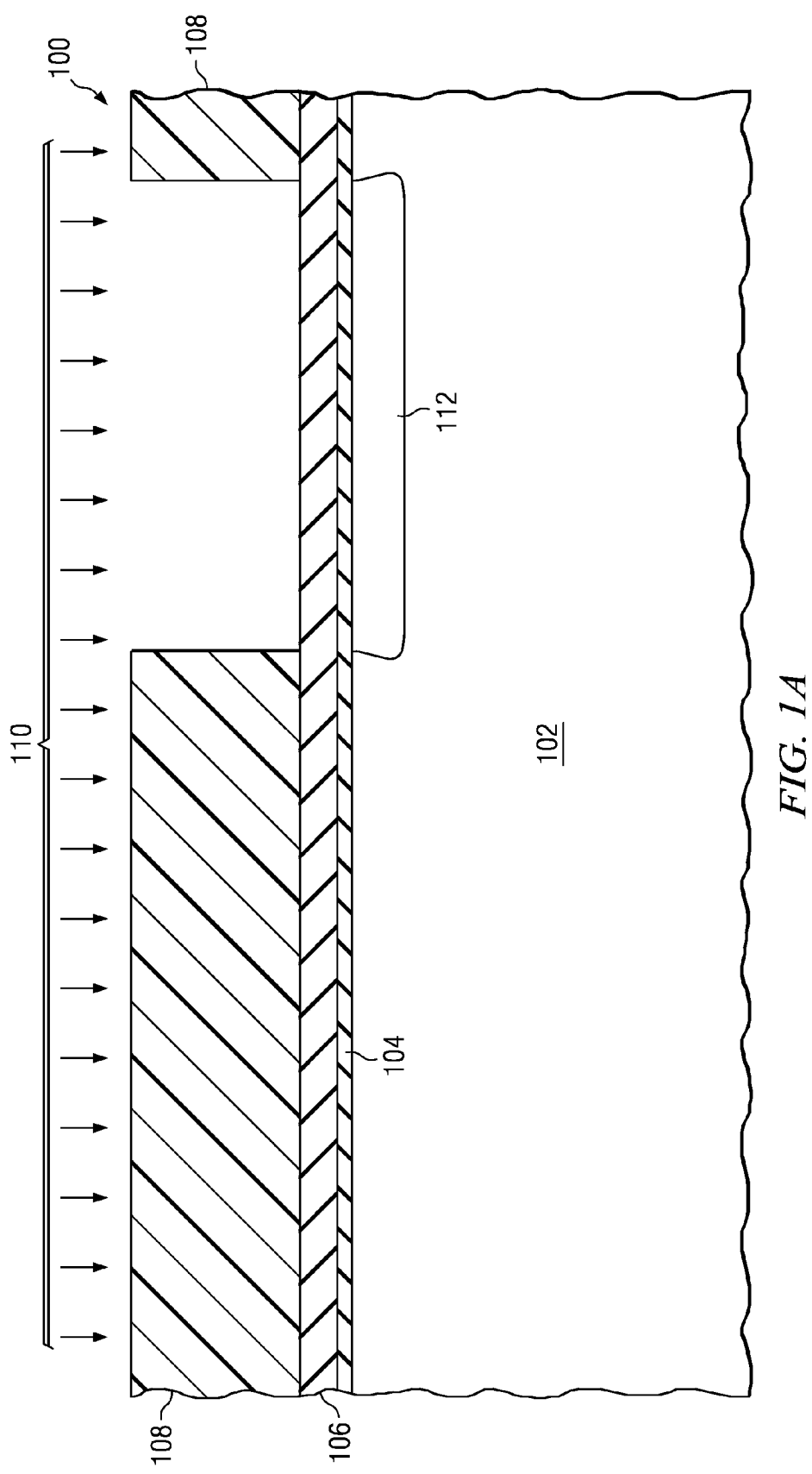
FIGS. 1A-1J are cross-sectional views showing stages of fabrication of a an example embodiment of a field effect transistor (FET) in accordance with principles of the invention.

FIG. 1A shows a device 100 fabricated on a silicon substrate 102 which may, for example, be a p-type single crystal wafer having an electrical resistivity of 0.5 to 100 ohm-cm. A first sacrificial oxide layer 104, such as a 5 to 40 nanometer thick layer of thermally grown silicon dioxide, is formed on a top surface of the substrate 102 to protect the top surface during subsequent processing. A silicon nitride layer 106, such as a 40 to 100 nanometer thick layer of silicon nitride deposited by low pressure chemical vapor deposition (LPCVD) or plasma enhanced chemical vapor deposition (PECVD) processes, is formed over the oxide layer 104 for the purpose of masking regions defined for active areas in the device 100 during later field oxide growth. A photoresist layer 108 is formed and patterned over the silicon nitride layer 106 using known photolithographic techniques to define regions for a doped well in a drain area of the example MOS transistor. For the example NMOS transistor, the well takes the form of an well doped with an n-type dopant (n-well). An ion implant 110 of n-type dopants (such as phosphorus, and possibly arsenic and/or antimony, conducted at, for example, a total dose of $1 \times 10^{12}$ to $1 \times 10^{14}$ atoms/cm$^2$ at one or more energies of 50 and 600 keV) is performed through the silicon nitride layer 106 and the oxide layer 104 into regions of the substrate left uncovered by the patterned photoresist layer 108, to form an implanted n-well region 112 that extends to a depth into the substrate 102 of, e.g., 100 to 1,000 nanometers. After completion of the ion implant 110, the photoresist layer 108 is removed, such as by exposing it to an oxygen containing plasma, followed by a wet clean-up to remove organic residue from the top surface of the silicon nitride layer 106.

Figure 1B:
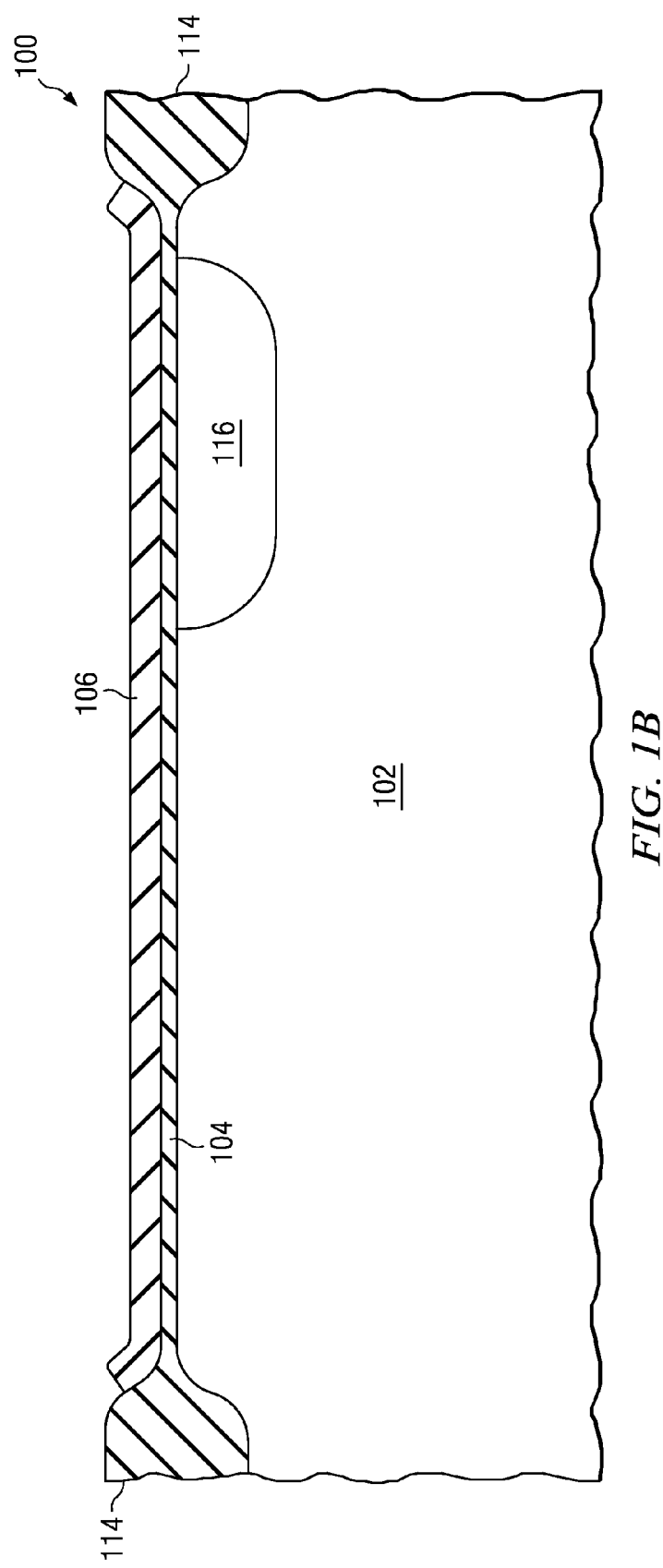

FIG. 1B shows the device 100 after formation of field oxide isolation elements 114 in the substrate 102 in regions where the silicon nitride layer 106 has been removed. The placement of the field oxide isolation elements 114 can be accomplished, for example, by forming and patterning another layer of photoresist (not shown) over the silicon nitride layer and etching the silicon nitride layer 106 from regions left uncovered by the patterned photoresist. The field oxide isolation elements 114 can then be formed by, for example, growing silicon dioxide thermally on the surface of the silicon substrate in regions where the silicon nitride layer 106 has been removed.

The silicon dioxide may, for example, be grown to a thickness of 500 to 200 nanometers in a furnace with an oxygen or steam ambient. During thermal growth of the field oxide isolation elements, the dopants from ion implantation 110 diffuse in the substrate 102 to form a diffused n-well region 116, which extends from the top surface of the substrate 102 to a depth of about 500 to 2000 nanometers. A junction gradient between the diffused n-well region 116 and the substrate 102 is more than one micron wide. It is advantageous for the field oxide isolation elements 114 to be formed by a method which also diffuses the dopants from ion implantation 110 to form the diffused n-well region 116 with the desired depth and junction gradient. The remainder of the silicon nitride layer 106 may be removed following the formation of the field oxide isolation elements 114.

Figure 1C:
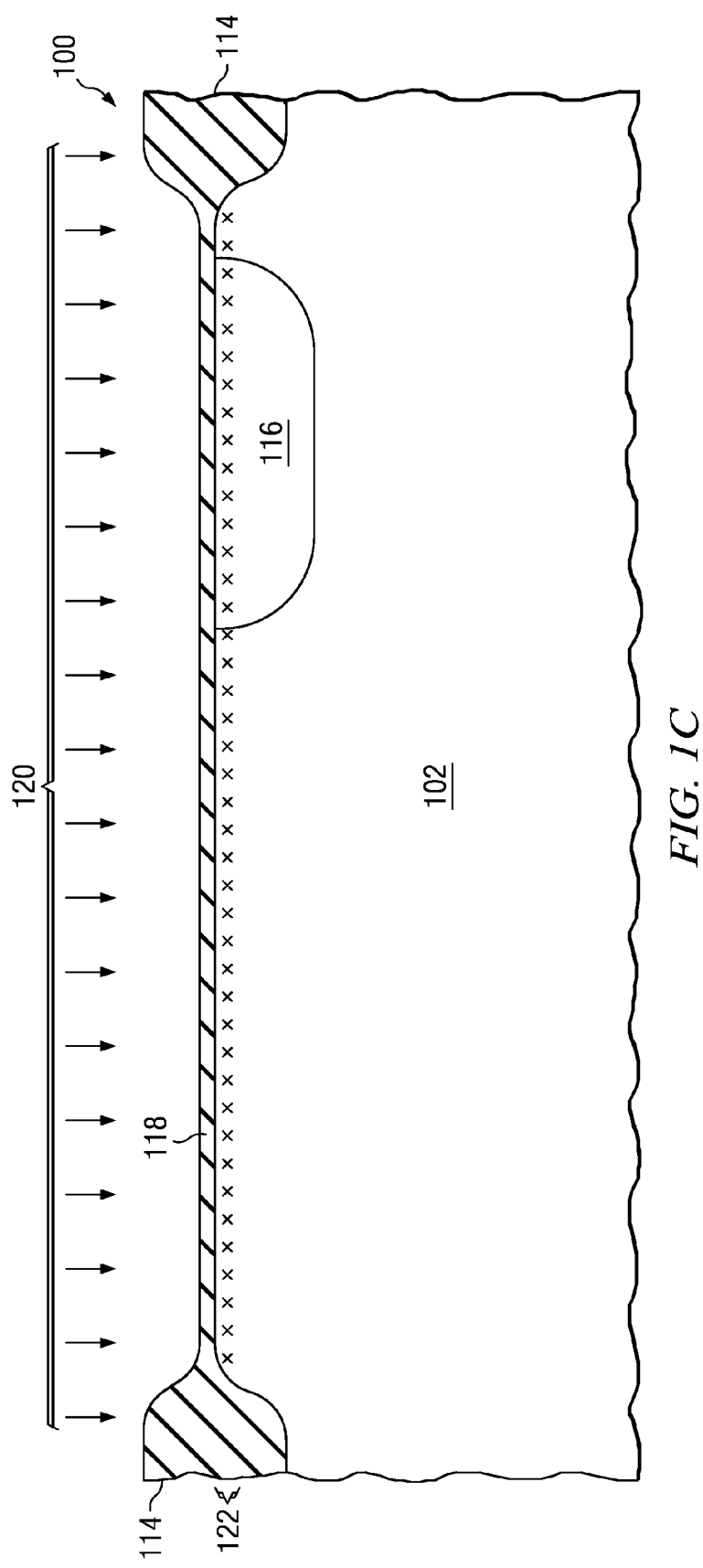

FIG. 1C shows the device 100 during a threshold adjust ion implant operation 120. An optional second sacrificial oxide layer 118, such as silicon dioxide 10 to 50 nanometers thick, is formed on a top surface of the substrate 102 to augment any existing oxide for the purpose of protecting the top surface of the substrate 102 during subsequent processing. In contrast to the implant 110, the illustrated ion implant operation 120 is performed as a blanket implantation of the relevant part of the substrate 102, without using a patterned photoresist layer to block portions of the substrate 102 from dopant implantation. For the described NMOS transistor implementation, p-type dopants (such as boron, and possibly gallium and/or indium, implanted at an energy of 10 to 70 keV at a total dose of $1\times10^{11}$ to $1\times10^{13}$ atoms/cm$^2$) may be implanted to form the implanted threshold adjust dopants 122 to a depth of 10 to 200 nanometers below the top surface of the substrate 102. (The depiction of dopant atoms implanted into field oxide isolation elements 114 is omitted in FIG. 1C for clarity.) Performing the MOS transistor threshold adjust ion implant 120 without a patterned photoresist is advantageous because it reduces fabrication cost.

Figure 1D:
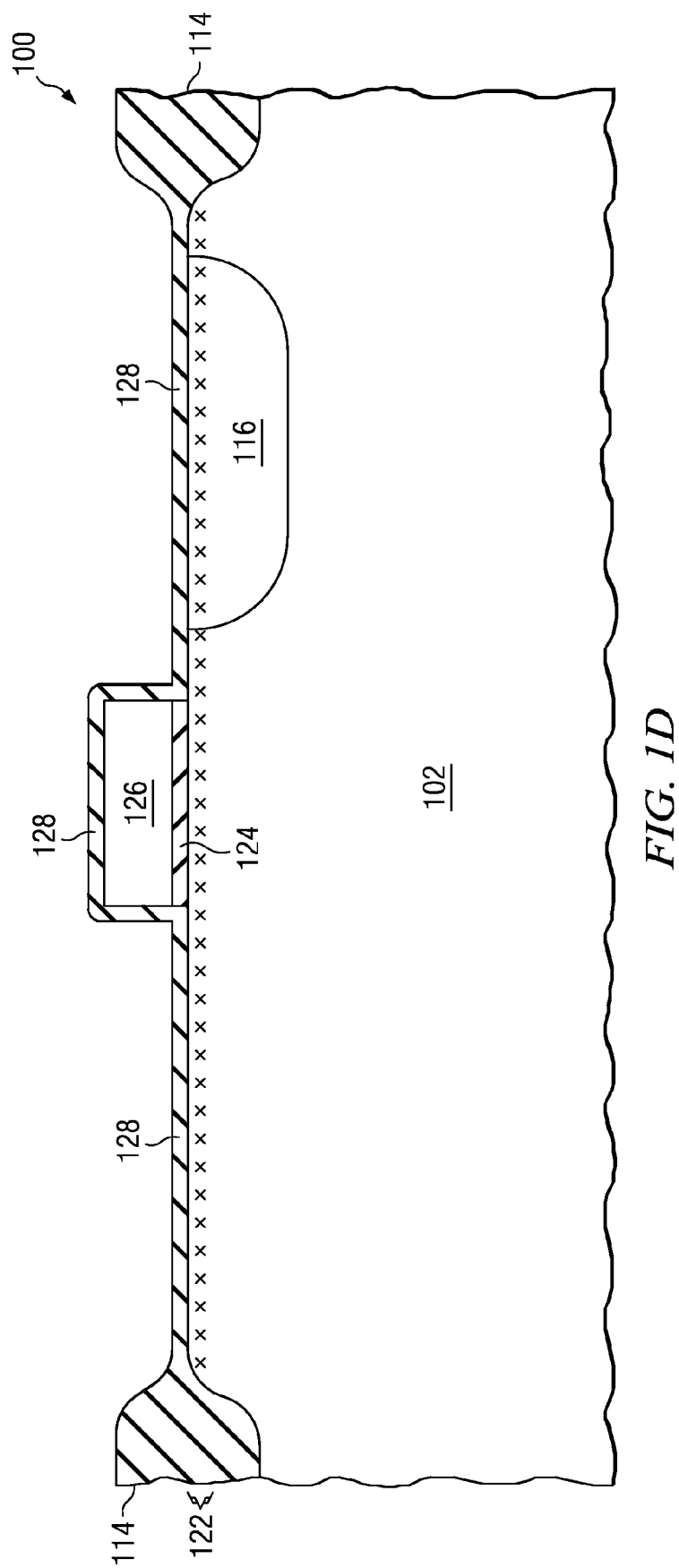

FIG. 1D shows the device 100 after formation of a transistor gate structure. Previous oxide is removed from the surface of the substrate 102, such as by etching in a dilute solution of hydrofluoric acid (HF). A gate dielectric layer 124 (such as 10 to 30 nanometers thick layer of silicon dioxide, nitrogen-doped silicon dioxide, silicon oxynitride, hafnium oxide, layers of silicon dioxide and silicon nitride, or other insulating material) is formed on the substrate 102 and a gate electrode layer 126 (such as a 100 and 1000 nanometers thick layer of deposited polysilicon) is formed over the gate dielectric layer 124. The gate electrode layer 126 and gate dielectric layer 124 are then patterned into the transistor gate structure such as by etching through a patterned photoresist layer to remove at least the portion of the material (e.g., polysilicon) of gate electrode layer 126 outside a pattern-defined gate structure region. After forming the gate structure, a conformal dielectric layer 128, such as a 10 to 50 nanometers thick layer of silicon dioxide, is formed on exposed surfaces of the gate structure and the substrate 102, such as by exposing the device 100 to an oxidizing ambient at a temperature above 800° C. The conformal dielectric layer 128 may, of course, also be formed of other materials and by other processes.

Figure 1E:
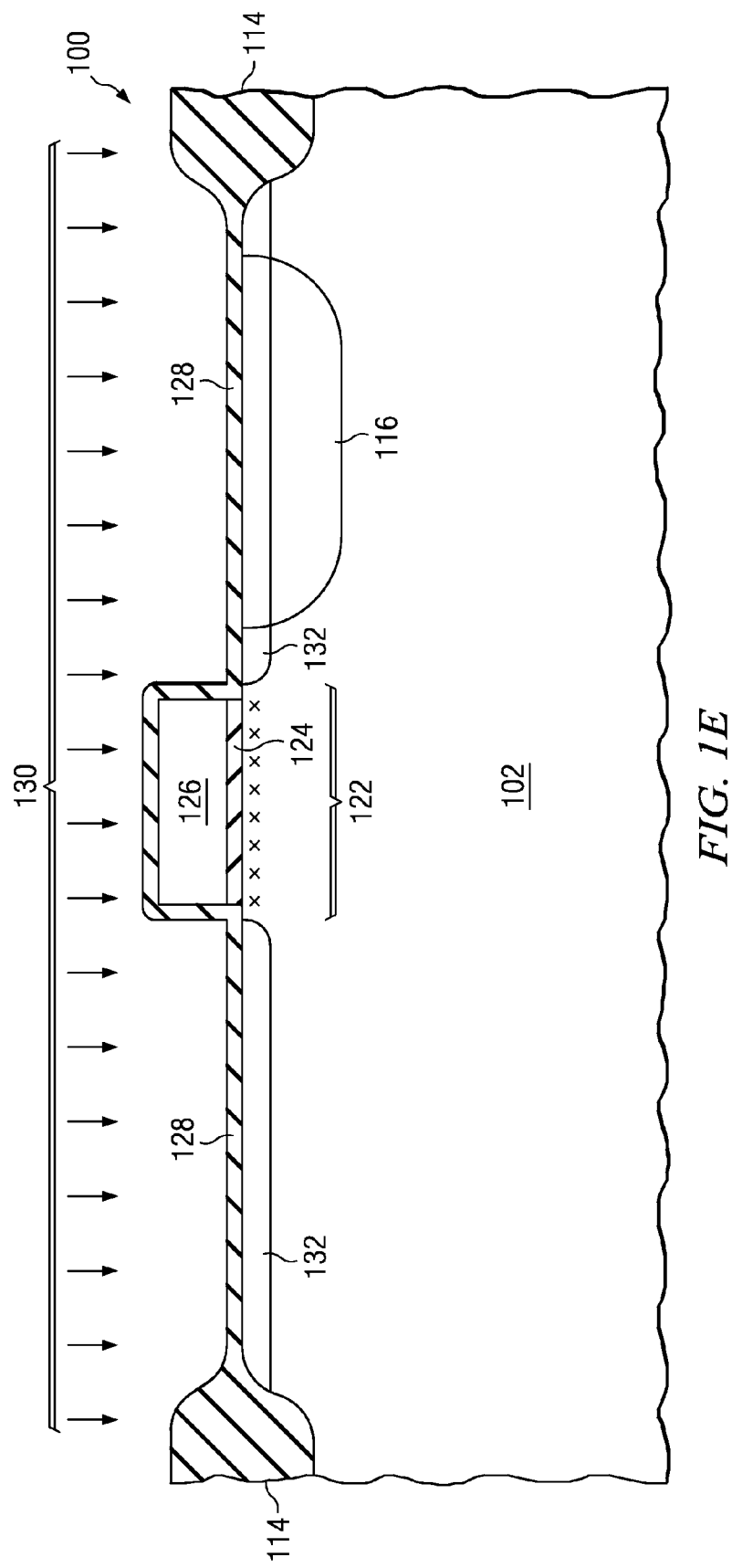

FIG. 1E shows the device 100 during a lightly doped drain (LDD) ion implantation operation 130. Again, as with the ion implant 120, the ion implant 130 is performed as a blanket implantation of the relevant part of the substrate 102, without using a patterned photoresist layer to block portion of the substrate from dopant implantation. For the described NMOS transistor implementation, n-type dopants (such as phosphorus, and possibly arsenic and/or antimony, implanted at an energy of 50 to 250 keV at a total dose of $3\times10^{11}$ to $1\times10^{14}$ atoms/cm$^2$) may be implanted to form n-type LDD implanted regions 132 to a depth of 50 to 200 nanometers below the top surface of the substrate 102. The implantation of n-type dopants into the LDD implanted regions 132 serves to counterdope the prior implantation of p-type dopants in the same regions by the threshold adjust implant 120. The patterned gate structure serves to mask against counterdoping of the prior dopants (shown by x's in FIG. 1E) in the channel region below the dielectric 124. Performing the LDD ion implant operation 130 without an additional photoresist pattern is advantageous because it further reduces the fabrication cost.

Figure 1F:
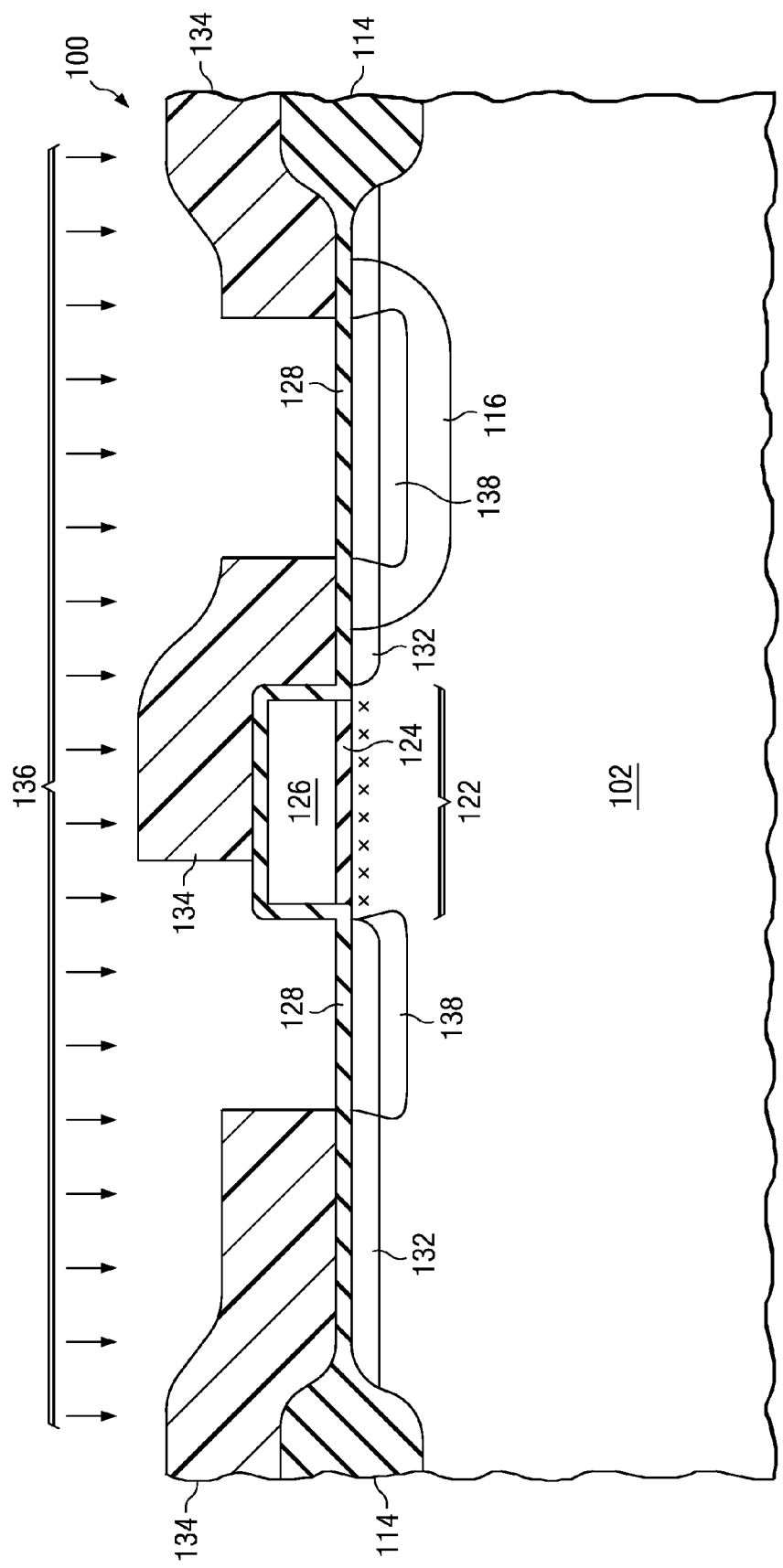

FIG. 1F shows the device 100 during an n-type source and drain (NSD) ion implantation operation 136. A photoresist layer 134 is formed and patterned over dielectric layer 128 using photolithographic methods to define a source region adjacent to one side of the gate structure 124/126, and a drain region spaced, e.g., about 1 to 2 microns away from the other side of the gate structure 124/126. For the described NMOS transistor implementation, n-type dopants (such as phosphorus, and possibly arsenic and/or antimony, implanted at one or more energies of 30 to 250 keV at a total dose of $3\times10^{14}$ to $3\times10^{16}$ atoms/cm$^2$) may be implanted into the substrate 102 through the dielectric layer 128 to form n-type source/drain (NSD) implanted regions 138 extending to a depth of 50 to 200 nanometers from the top surface of the substrate 102. The patterned photoresist layer 134 is removed after completing the NSD ion implant 136, such as by exposing it to an oxygen containing plasma, followed by a wet clean-up to remove organic residue from the top surface of the dielectric layer 128.

Figure 1G:
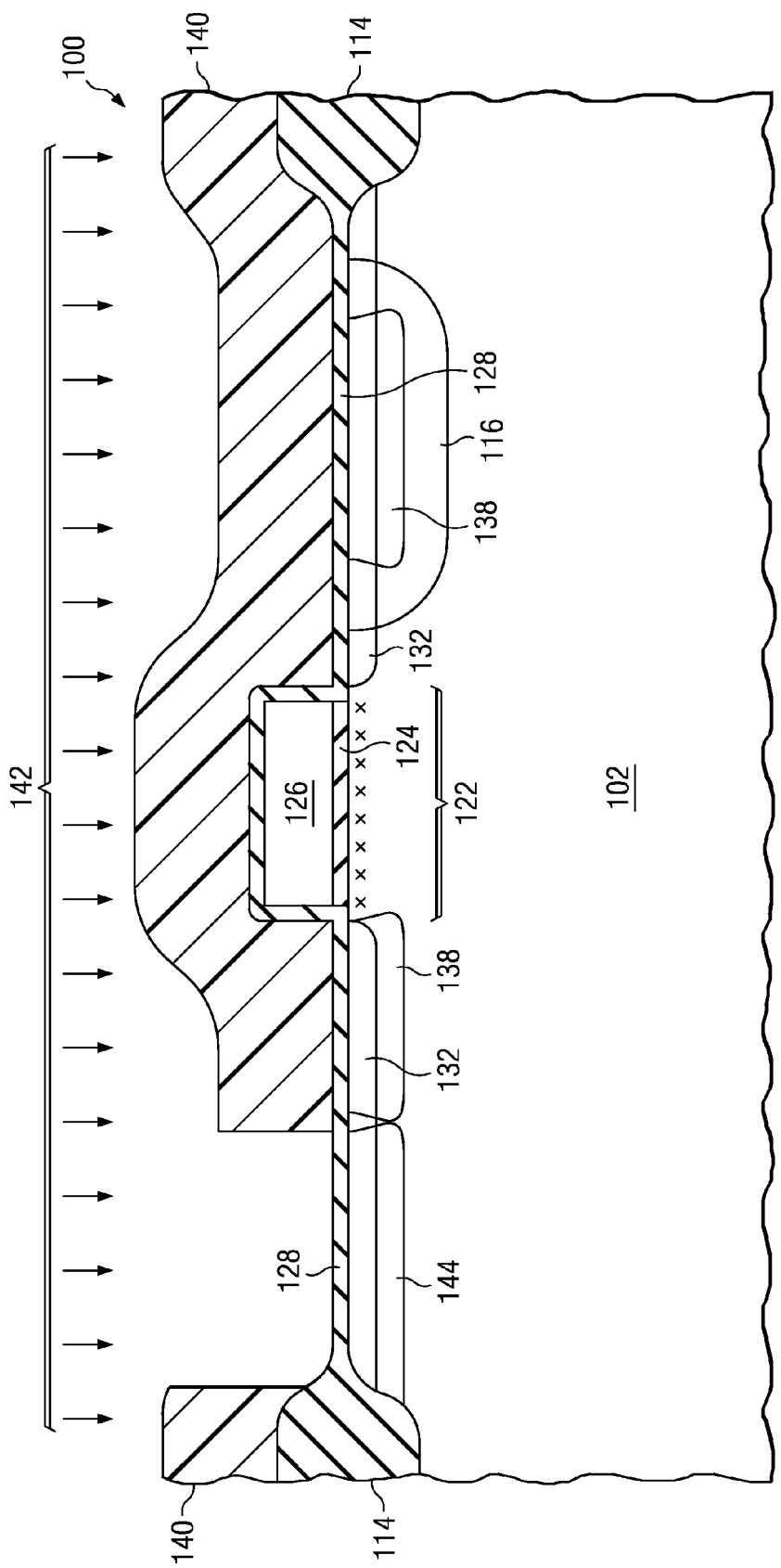

FIG. 1G shows the device 100 during a p-type source and drain (PSD) ion implantation operation 142. A photoresist layer 140 is formed and patterned over dielectric layer 128 using photolithographic methods to define a substrate contact area. For the described NMOS transistor implementation, p-type dopants (such as boron, e.g., in the form BF$_2$, and possibly gallium and/or indium, implanted at one or more energies of 10 to 100 keV at a total dose between $3\times10^{14}$ and $3\times10^{16}$ atoms/cm$^2$) may be implanted into the substrate 102 through the dielectric layer 128 to form p-type substrate contact implanted regions 144 extending to a depth of 50 to 200 nanometers from the top surface of the substrate 102. The patterned photoresist layer 140 is removed after completing the PSD implant 142 ion implanting the second set of p-type dopants 142, such as by exposing it to an oxygen containing plasma, followed by a wet clean-up to remove organic residue from the top surface of the dielectric layer 128.

Figure 1H:
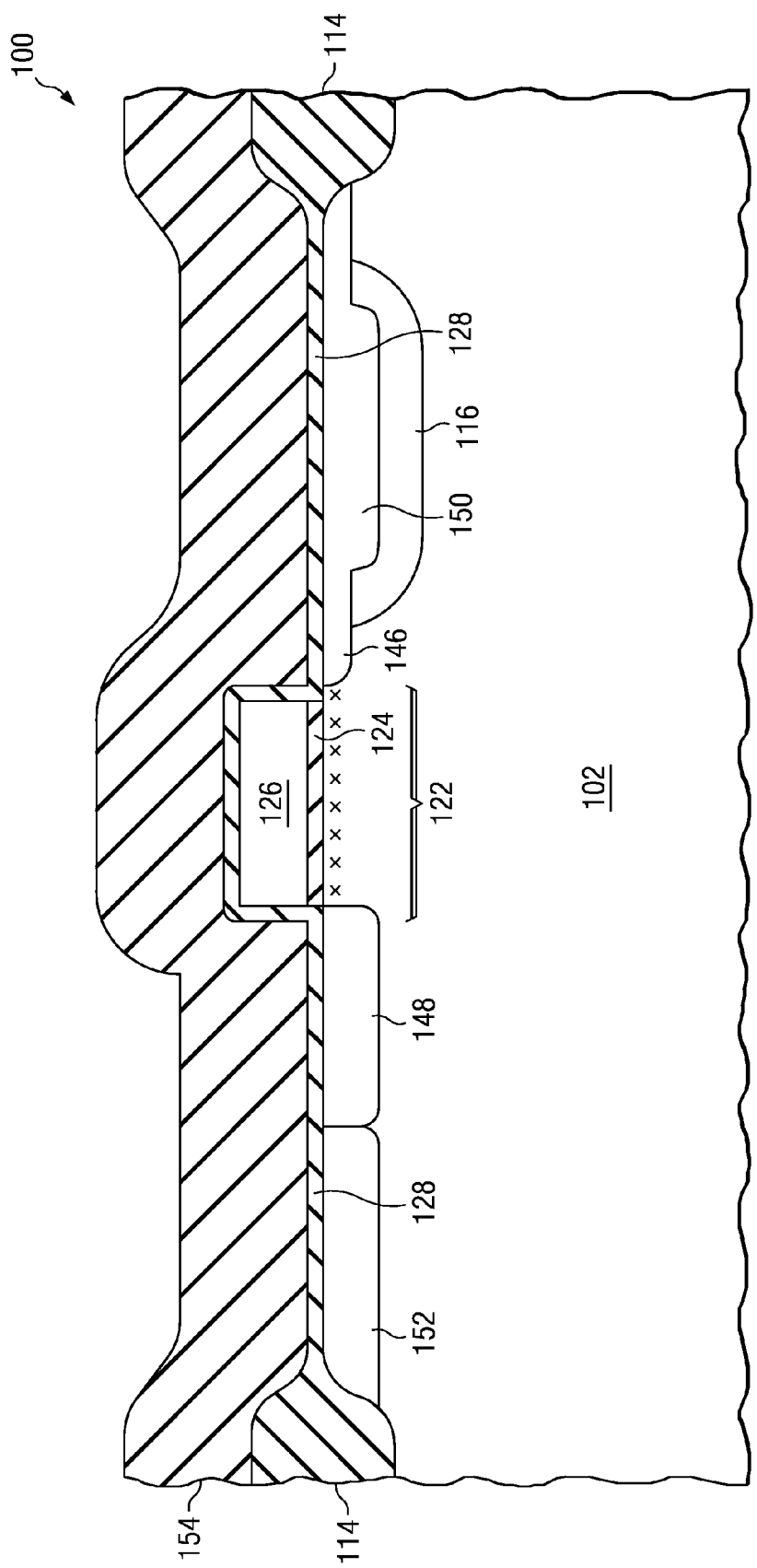

FIG. 1H shows the device 100 after formation of a pre-metal dielectric (PMD) layer 154, such as a layer of silicon dioxide, phosphosilicate glass (PSG) or borophosphosilicate glass (BPSG), deposited by plasma-enhanced chemical vapor deposition (PECVD) to a thickness of about 100 to 2000 nanometers. The PMD layer 154 may include an optional PMD liner, such as, e.g., a silicon nitride or silicon dioxide PMD liner deposited by PECVD to a thicken, e.g., by a chemical-mechanical polishing (CMP) process, to facilitate interconnect formation. An optional PMD cap layer, such as, e.g., a 10 to 100 nanometer thick layer of hard material like silicon nitride, silicon carbide nitride and/or silicon carbide, may be formed over the PMD layer 154. Formation of the PMD layer 154 may be performed in a thermal process (such as, e.g., at a temperature of 800° C. to 950° C. for about 20 to 120 minutes) which acts to also activate the n-type dopants implanted by implants 130, 136 and the p-type dopants implanted by implant 142 to form an n-type diffused LDD region 146, an n-type diffused source region 148, an n-type diffused drain region 150, and a p-type diffused substrate contact region 152. In an alternative embodiment, a separate anneal may be performed to activate the dopants before formation of the PMD layer 154.

Figure 1I:
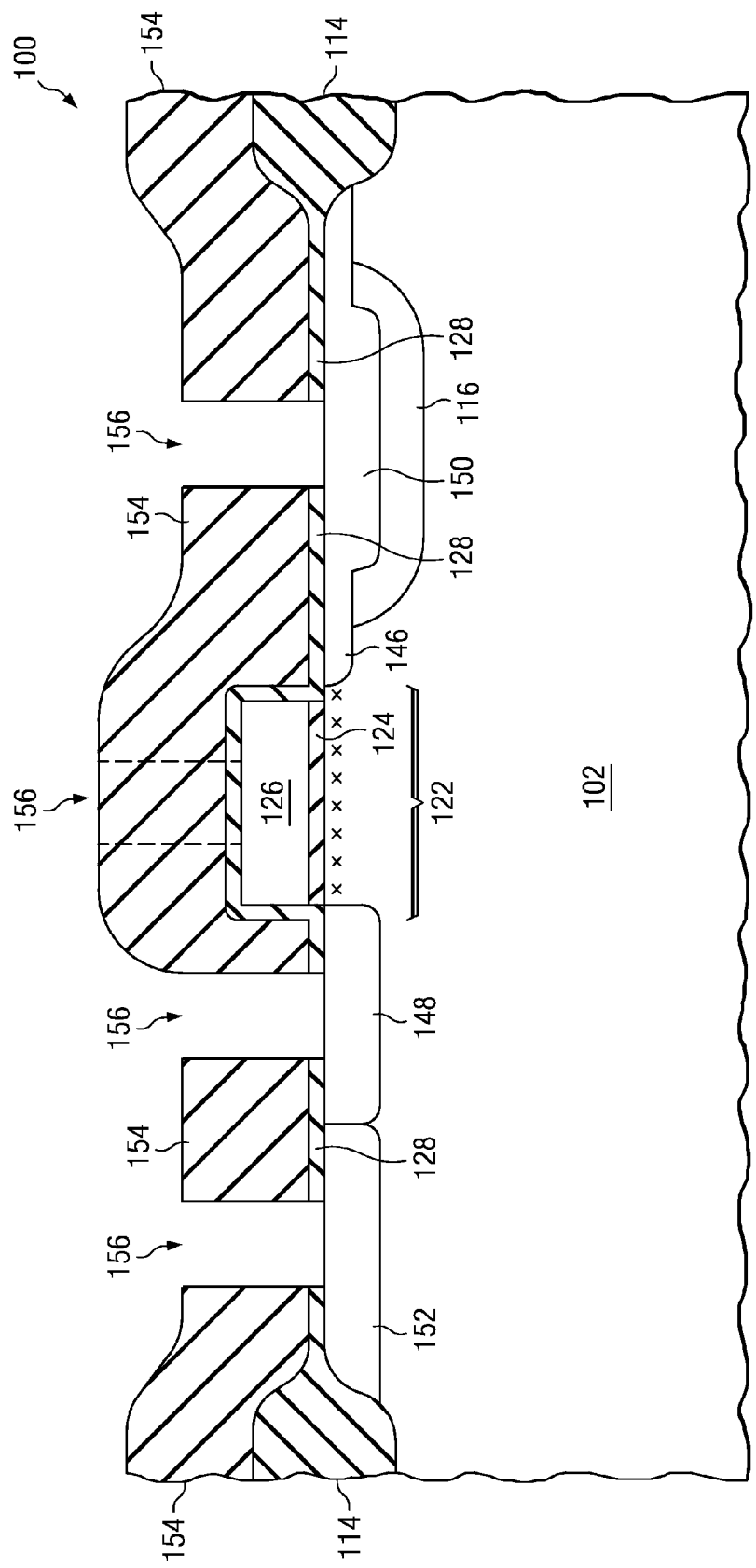

FIG. 1I shows the device 100 after contact holes 156 are formed in the PMD layer 154. The holes 154 may be formed by depositing and patterning a photoresist layer over the PMD layer 154 by photolithographic methods to define contact hole regions, then etching uncovered portions of the PMD layer 154 and dielectric layer 128 to expose the n-type diffused drain region 150, the n-type diffused source region 148 and the p-type diffused substrate contact region 152. The patterned photoresist layer is removed after forming the contact holes 156, such as by exposing it to an oxygen containing plasma, followed by a wet clean-up to remove organic residue from the top surface of the PMD layer 154.

Figure 1J:
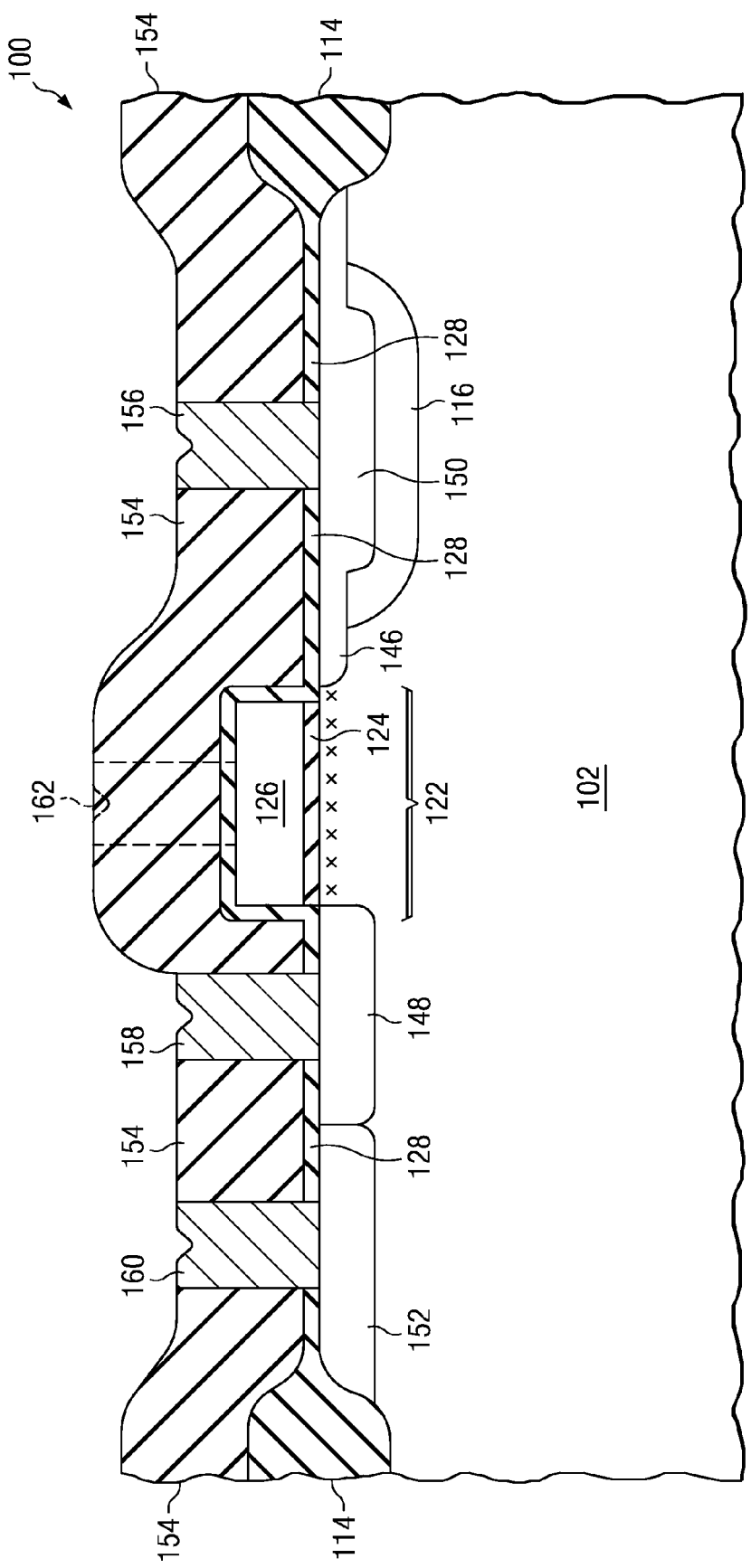

FIG. 1J shows the device 100 after formation of conductive contacts 156, 158, 160 within the contact holes 156. A layer of conductive material (such as titanium, tungsten, titanium tungsten, or other metal or conductive material which exhibits good adhesion to the PMD layer 154) is formed over the PMD layer 154 and within the contact holes 154 by physical vapor deposition (PVD) or other material deposition process. The conductive material is then selectively removed from over the PMD layer 154 by physical or chemical methods, leaving the conductive material in the contact holes 154 to form a drain contact 156, a source contact 158, a substrate contact 160, and a gate contact 162.

In a mode of operation of the NMOS transistor fabricated as described, a ground potential may be applied to the source contact 158 and substrate contact 160; a gate potential between ground potential and 5 to 10 volts (depending on the thickness the gate dielectric layer 124) may be applied to the gate contact; and a drain potential as high as 50 volts may be applied to the drain contact 156. This results in the formation of a depletion region at the junction between the diffused n-well region 116 and the p-type substrate 102, which reduces a potential across the gate dielectric layer 124. Under application of the voltage differential between the drain and source, the depletion region extends beyond the LDD region 146 toward the gate region below the gate structure 124/126. Current flows between the drain contact 156 and the source contact 158 via the n-type diffused drain region 150, the n-type diffused LDD region 146, an inversion region formed under the gate dielectric layer 124 (which is desirably modulated by the gate potential), and the n-type diffused source region 148.

Figure 2A:
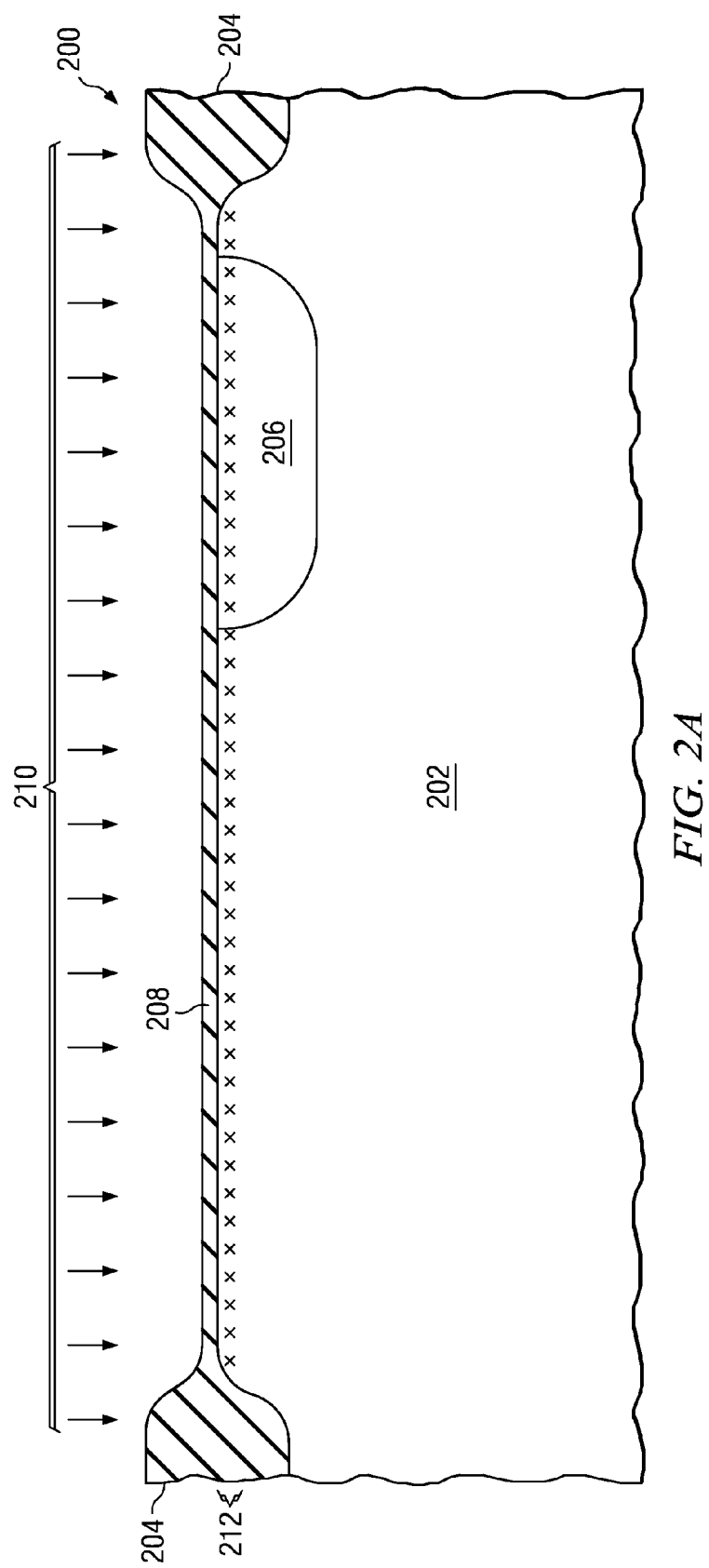
FIGS. 2A-2C are cross-sectional views showing stages of fabrication of a modified embodiment of the described field-effect transistor.
Figure 2B:
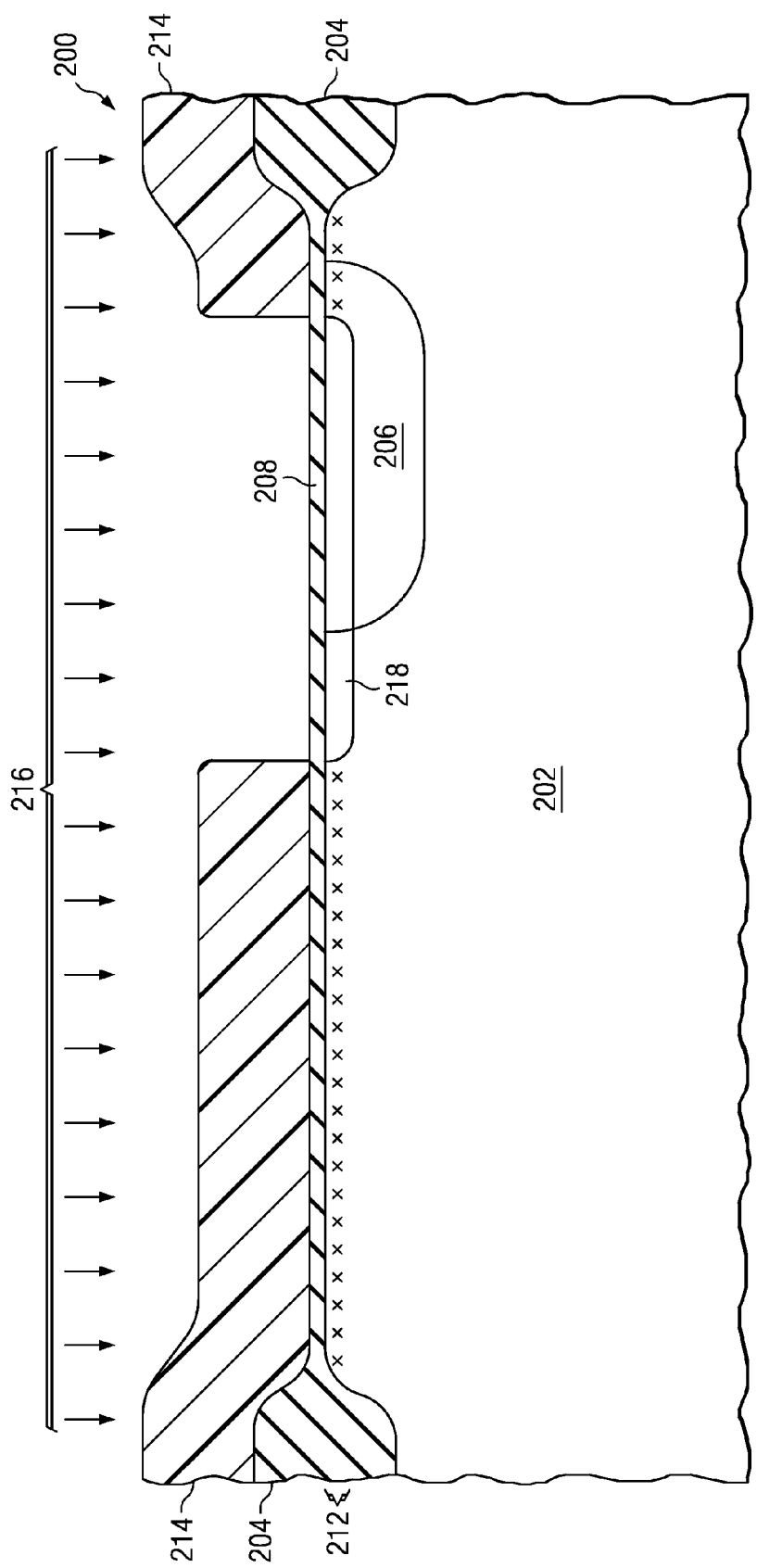
Figure 2C:
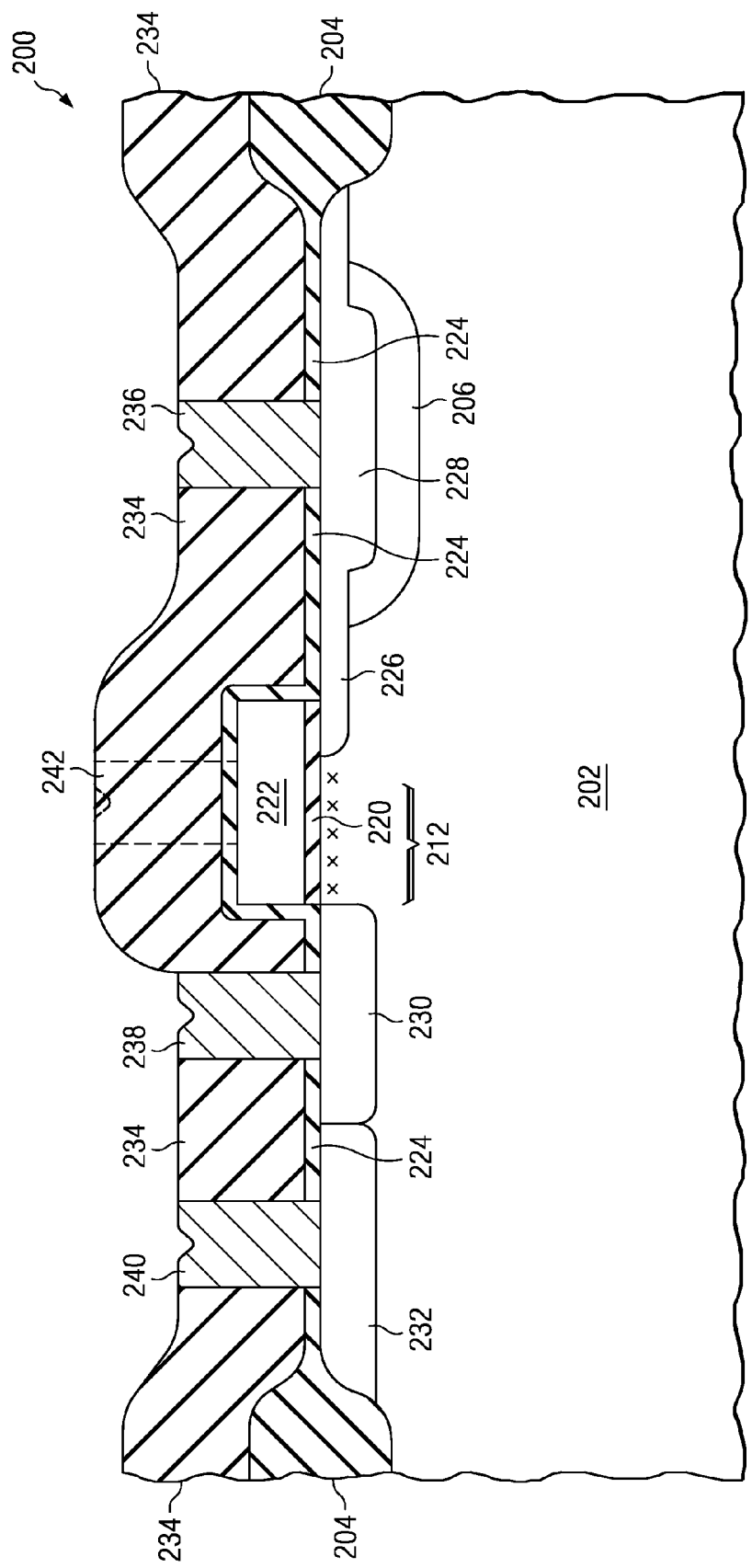

FIGS. 2A-2C illustrate steps in a method of fabricating an integrated circuit including a MOS transistor according to a modified form 200 of the example embodiment already discussed in connection with the description of the fabrication of device 100 above. The modified device 200 uses photolithography and selective implantation, rather than a blanket implantation (like implant 130 used for device 100 and described above with reference to FIG. 1E), to form an LDD drain region that extends partially under the transistor gate structure. Again, for purposes of brevity, only the steps in fabrication of a device including an n-channel MOS (NMOS) transistor are described, with the realization that those skilled in the art to which the invention relates will readily understand that by using opposite doping the same principles can be applied to the fabrication of an integrated circuit including a p-channel MOS (PMOS) transistor (or both NMOS and PMOS transistors). FIG. 2A shows the modified device 200 at a stage of fabrication corresponding to the stage of fabrication shown and described with reference to FIG. 1C for the device 100. The steps for the fabrication of the example modified device 200 up to the stage illustrated in FIG. 2A may be the same as those described for the example device 100, so are not repeated.

FIG. 2A shows the device 200 (like the previously described device 100 in FIG. 1C) during a threshold adjust ion implant operation 210. Field oxide isolation elements 204 have already been formed as previously described, and an optional second sacrificial oxide layer 208, such as silicon dioxide to a thickness of 10 to 50 nanometers, has also been formed on a top surface of a substrate 202. A diffused n-well region 206 has also been formed in a drain area of the substrate 202 in the previously described manner. As with implant 120, the illustrated implant 210 is performed as a blanket implantation of the relevant part of the substrate 202, without using a patterned photoresist layer to block portions of the substrate 202 from dopant implantation. As before, for the NMOS transistor implementation, p-type dopants (such as boron, and possibly gallium and/or indium, implanted at an energy between 10 to 70 keV at a total dose of $1 \times 10^{11}$ to $1 \times 10^{13}$ atoms/cm$^2$) may be implanted to form the implanted threshold adjust dopants 212 to a depth of 10 to 200 nanometers below the top surface of the substrate 202.

FIG. 2B shows the device 200 during an ion implantation operation 216 to form a lightly doped drain (LDD) region having an extension (into the gate region) not formed in the fabrication of the previously described device 100. A photoresist layer 214 is formed and patterned over the oxide layer 208 to define a region for an extended LDD region in the drain area of the example MOS transistor. The illustrated photoresist layer shows an opening for the extended LDD region implant only in the drain area; however, it will be understood that the photoresist layer 214 may be also be patterned to define an optional LDD region for the source area if desired, simultaneously with providing the extended LDD region for the drain area. An ion implant 216 of n-type dopants 216 (such as phosphorus, and possibly arsenic and/or antimony, conducted at, for example, an energy between 50 and 250 keV at a total dose between $3 \times 10^{11}$ and $1 \times 10^{14}$ atoms/cm$^2$) may be implanted into the substrate 202 through the oxide layer 208 to form an n-type extended LDD implanted region 218 to a depth of 50 to 200 nanometers from the top surface of the substrate 202. The implantation of n-type dopants into the LDD implanted region 218 serves to counterdope the prior implantation of p-type dopants 212 in the same region by the threshold adjust implant 210. The photoresist layer 214 serves to mask against counterdoping of the prior dopants 212 (shown by x's in FIG. 2B) in the other regions below the oxide layer 208. Although a blanket implant such as implant 130 of FIG. 1E could also be performed in the fabrication of the modified device 200, it is contemplated that the usual procedure would be to perform the selective implantation 216 without also performing such a blanket implant. The photoresist layer 214 may, of course, also be patterned to define LDD areas for other transistors on the same IC.

FIG. 2C shows the device 200 at a subsequent stage of fabrication, similar to that depicted in FIG. 1J for device 100, with other features added as previously described with reference to FIGS. 1D and 1F-1J in connection with device 100. As described previously for gate dielectric layer 124 and gate electrode layer 126 of device 100, a gate dielectric layer 220 and a gate electrode layer 222 have been formed and patterned to provide a transistor gate structure, and a conformal dielectric layer 224 similar to dielectric layer 128 has been formed over the gate structure and portions of the substrate 202. In departure from the fabrication of device 100, however, a diffused extended LDD region 226 (provided by thermal activation of the extended LDD region 218) is present in the device 200 shown in FIG. 2C, and a portion of the patterned gate structure overlaps a portion of the diffused LDD extension region 226 (e.g., by 0.2 to 1 micron in the illustrated implementation). FIG. 2C also depicts an n-type diffused drain region 228, a p-type diffused contact region 232 and an n-type diffused source region 230 which may be formed as previously described for the formations of n-type diffused drain region 150, p-type diffused contact region 152 and n-type diffused source region 148. FIG. 2C also depicts a pre-metal deposition (PMD) layer 234 and contacts 236, 238, 240 and 242 which may be formed as previously described for the formations of PMD layer 154 and contacts 156, 158, 160 and 162.

In a mode of operation of the NMOS transistor of the modified embodiment, similarly to the mode of operation described previously in connection with device 100, a ground potential may be applied to the source contact 238 and the substrate contact 240; a gate potential between ground potential and 5 to 10 volts (depending on the thickness the gate dielectric layer 220) may be applied to the gate contact; and a drain potential as high as 50 volts may be applied to the drain contact 236. This results in formation of a depletion region at the junction between the diffused n-well region 206 and the p-type substrate 202, which reduces a potential across the gate dielectric layer 220. Under application of operating voltage, the depletion region will extend under the gate structure beyond the diffused extended LDD region 226, thereby enabling the transistor to accommodate the application of high voltages for short periods. Current then flows between the drain contact 236 and the source contact 238 via the n-type diffused drain region 228, the n-type diffused LDD region 226, an inversion region formed under the gate dielectric layer 220 (which is desirably modulated by the gate potential), and the n-type diffused source region 230. The configuration of the instant embodiment in which a portion of the MOS transistor gate structure 220/222 overlaps a portion of the LDD diffused region 226 is advantageous because it may increase an operational lifetime of the power FET by a factor of 100.

Those skilled in the art to which the invention relates will appreciate that many other embodiments and variations of embodiments are possible within the scope of the claimed invention.

What is claimed is:

1. A method of forming an integrated circuit including a drain extended metal oxide semiconductor (MOS) field effect transistor (FET), comprising:
    providing a substrate of given conductivity type having an isolated active area including source, drain, channel and substrate contact regions;
    performing a selective first implant through a patterned mask of dopant of opposite conductivity type, to form a well in a portion of the drain region laterally spaced from the channel region;
    performing a blanket threshold adjust second implant of dopant of the given conductivity type into the source region, into the drain region including into the well, into the channel region and into the substrate contact region;
    forming a gate structure over the channel region;
    after forming the gate structure, performing a blanket lightly doped drain third implant of dopant of the opposite conductivity type into the source region, into the drain region including into the well and into the substrate contact region, to form a lightly doped drain region in the drain region extending laterally beyond the well toward the channel region;
    performing a selective fourth implant through a patterned mask of dopant of the opposite conductivity type, to form a source adjacent to the channel region in the source region and a drain laterally spaced from the channel region within the well in the drain region;
    performing a selective fifth implant through a patterned mask of dopant of the given conductivity type, to form a substrate contact area in the substrate contact region;
    forming a pre-metal dielectric layer over the substrate; and
    forming conductive contacts through the pre-metal dielectric layer to the source, the drain, the gate structure and the substrate contact area;
    wherein the isolated active area is defined by forming oxide isolation elements in the substrate; and
    wherein forming the oxide isolation elements includes forming a nitride layer over the substrate prior to performing the selective first implant; and, after performing the selective first implant, forming field oxide isolation elements in the substrate by thermal growth in regions where the nitride layer has been removed, the implanted dopant of opposite conductivity type in the well region thermally diffusing during the thermal growth.

2. The method of claim 1, whereby, under application of an operating voltage differential between the source and drain, a depletion region will form at the junction of the well and the substrate and extend toward the channel region beyond the lightly doped drain region.

3. The method of claim 1, wherein the lightly doped drain region extends partially under the gate structure.

4. The method of claim 1, wherein the well includes between $1\times10^{12}$ and $1\times10^{14}$ dopant atoms/cm$^2$ and extends from a top surface of the substrate to a depth of 500 to 2000 nanometers.

5. The method of claim 4, wherein the second implant includes an implant of dopants of between $1\times10^{11}$ and $1\times10^{13}$ dopant atoms/cm$^2$ and extends from the top surface to a depth of 10 to 200 nanometers.

6. The method of claim 5, wherein the lightly doped drain region includes between $3\times10^{11}$ and $1\times10^{14}$ dopant atoms/cm$^2$ and extends from the top surface to a depth of 50 to 200 nanometers.

7. The method of claim 1, further comprising a conformal layer of dielectric material formed between 10 to 50 nanometers thick on at least lateral surfaces of the patterned gate structure.

8. A method of forming an integrated circuit including a drain extended metal oxide semiconductor (MOS) field effect transistor (FET), comprising:
    providing a substrate of p-type conductivity having an isolated active area including source, drain, channel and substrate contact regions;
    performing a selective first implant through a patterned mask of n-type dopant, to form an n-well in a portion of the drain region laterally spaced from the channel region;
    performing a blanket threshold adjust second implant of p-type dopant into the source region, into the drain region including into the well, into the channel region and into the substrate contact region;
    forming a gate structure over the channel region;
    after forming the gate structure, performing a blanket lightly doped drain third implant of n-type dopant into the source region, into the drain region including into the well and into the substrate contact region, to form a lightly doped drain region in the drain region extending laterally beyond the well toward the channel region;

performing a selective fourth implant through a patterned mask of n-type dopant, to form a source adjacent to the channel region in the source region and a drain laterally spaced from the channel region within the well in the drain region;

performing a selective fifth implant through a patterned mask of p-type dopant, to form a substrate contact area in the substrate contact region;

forming a pre-metal dielectric layer over the substrate; and forming conductive contacts through the pre-metal dielectric layer to the source, the drain, the gate structure and the substrate contact area;

wherein the isolated active area is defined by forming oxide isolation elements in the substrate; and wherein forming the oxide isolation elements includes forming a nitride layer over the substrate prior to performing the selective first implant; and, after performing the selective first implant, forming field oxide isolation elements in the substrate by thermal growth in regions where the nitride layer has been removed, the implanted n-type dopant in the n-well region thermally diffusing during the thermal growth.

9. The method of claim 8, whereby, under application of an operating voltage differential of about 40 to 50 volts between the source and drain, a depletion region will form at the junction of the n-well and the p-type substrate and extend toward the channel region beyond the lightly doped drain region.

10. The method of claim 9, whereby the formed depletion region is more than 1 micron wide.

11. The method of claim 8, wherein the n-well includes between $1\times10^{12}$ and $1\times10^{14}$ dopant atoms/cm$^2$ and extends from a top surface of the p-type substrate to a depth of 500 to 2000 nanometers.

12. The method of claim 11, wherein the second implant includes an implant of p-type dopants of between $1\times10^{11}$ and $1\times10^{13}$ dopant atoms/cm$^2$ and extends from the top surface to a depth of 10 to 200 nanometers.

13. The method of claim 12, further comprising a thermal process to activate the lightly doped drain region; and wherein the activated lightly doped drain region includes between $3\times10^{11}$ and $1\times10^{14}$ dopant atoms/cm$^2$ and extends from the top surface to a depth of 50 to 200 nanometers.

14. The method of claim 13, the field oxide isolation elements comprising silicon dioxide between 500 and 1200 nanometers thick thermally grown on the top surface.

15. The method of claim 13, wherein forming the gate structure includes forming a gate dielectric layer over the substrate, and forming a gate electrode layer over the gate dielectric layer; wherein the gate dielectric layer is formed between 10 to 30 nanometers thick on the top surface, and the gate electrode layer is a layer of polysilicon formed between 100 and 1000 nanometers thick over the gate dielectric layer.

16. The method of claim 15, further comprising forming a conformal layer of dielectric material between 10 to 50 nanometers thick on at least lateral surfaces of the patterned gate structure.

* * * * *